United States Patent
Corsi et al.

(10) Patent No.: US 6,452,451 B1
(45) Date of Patent: Sep. 17, 2002

(54) METHOD FOR ADJUSTING A BIPOLAR OUTPUT STAGE FOR IMPROVED FREQUENCY RESPONSE

(75) Inventors: Marco Corsi, Allen, TX (US); Stephen W. Milam, Greensboro, NC (US); Neil Gibson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/705,374

(22) Filed: Nov. 3, 2000

Related U.S. Application Data
(60) Provisional application No. 60/167,199, filed on Nov. 23, 1999.

(51) Int. Cl.[7] ................................................. H03F 3/18
(52) U.S. Cl. ........................ 330/263; 330/267; 330/268
(58) Field of Search ................................. 330/263, 267, 330/268

(56) References Cited

U.S. PATENT DOCUMENTS 3,487,320 A * 12/1969 Heidecker et al. .......... 330/263
6,184,750 B1 * 2/2001 Somerville .................. 330/268

* cited by examiner

*Primary Examiner*—Michael B Shingleton
(74) *Attorney, Agent, or Firm*—Alan K. Stewart; Wade James Brady, III; Frederick J. Telecky, Jr.

(57) ABSTRACT

A method for adjusting the output response of a complementary bipolar operational amplifier includes: providing a first bipolar transistor 14; providing a second bipolar transistor 16 coupled to the first bipolar transistor 14; providing a first current source 26 coupled to a base of the first bipolar transistor 14; providing a second current source 28 coupled to a base of the second bipolar transistor 16; providing a third bipolar transistor 10 coupled to the base of the first bipolar transistor 14; providing a fourth bipolar transistor 12 coupled to the base of the second bipolar transistor 16; providing a first resistor 20 coupled between a base of the third transistor 10 and a common node; providing a second resistor 18 coupled between a base of the fourth transistor 12 and the common node; providing a capacitor 30 coupled to the common node; providing a first input stage current source 24 coupled to the first resistor 20; providing a second input stage current source 22 coupled to the fourth resistor 18; and adjusting the first and second current sources 26 and 28 and the first and second resistors 20 and 18 to optimize the output circuit.

3 Claims, 1 Drawing Sheet

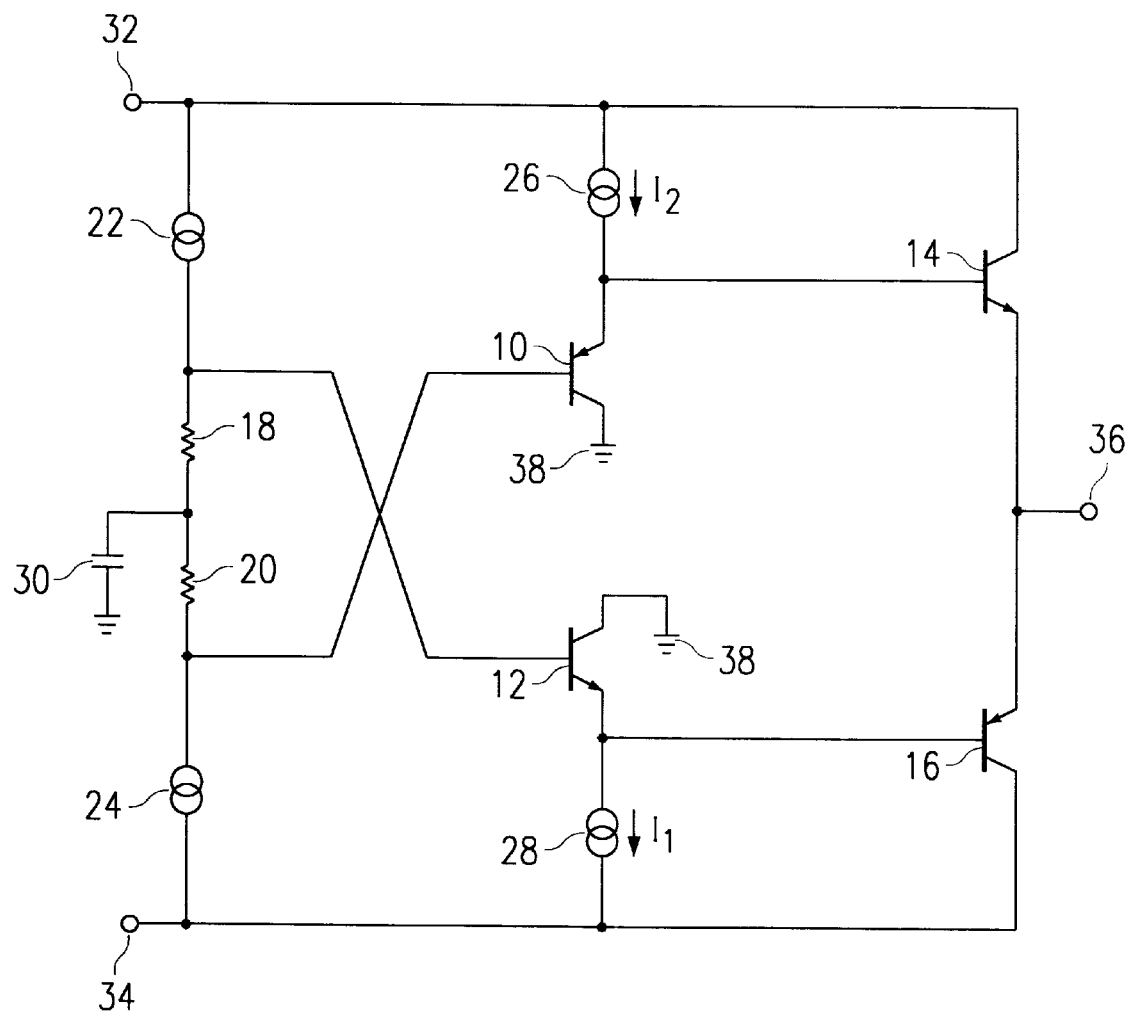

METHOD FOR ADJUSTING A BIPOLAR OUTPUT STAGE FOR IMPROVED FREQUENCY RESPONSE

This application claims priority under 35 USC §119 (e)(1) of provisional application No. 60/167,199, filed Nov. 23, 1999.

FIELD OF THE INVENTION

This invention generally relates to electronic systems and in particular it relates to complementary bipolar operational amplifiers.

BACKGROUND OF THE INVENTION

There are two paths from the input to the output of an output stage in a typical complementary bipolar operational amplifier. Usually each path has a slightly different frequency response which can cause some high frequency problems when designing video amps.

SUMMARY OF THE INVENTION

Generally, and in one form of the invention, the method for adjusting the output response of a complementary bipolar operational amplifier includes: providing a first bipolar transistor; providing a second bipolar transistor coupled to the first bipolar transistor; providing a first current source coupled to a base of the first bipolar transistor; providing a second current source coupled to a base of the second bipolar transistor; providing a third bipolar transistor coupled to the base of the first bipolar transistor; providing a fourth bipolar transistor coupled to the base of the second bipolar transistor; providing a first resistor coupled between a base of the third transistor and a common node; providing a second resistor coupled between a base of the fourth transistor and the common node; providing a capacitor coupled to the common node; providing a first input stage current source coupled to the third resistor; providing a second input stage current source coupled to the fourth resistor; and adjusting the first and second current sources and the first and second resistors to optimize the output circuit.

DESCRIPTION OF THE DRAWINGS

In the drawings:

FIG. 1 is a schematic circuit diagram of an output stage of a complementary bipolar operational amplifier.

DESCRIPTION OF PREFERRED EMBODIMENTS

Referring to FIG. 1, a circuit diagram of an output stage of a complementary bipolar operational amplifier is illustrated. The circuit of FIG. 1 includes transistors 10, 12, 14, and 16; resistors 18 and 20; current sources 22, 24, 26, and 28; capacitor 30; positive power supply node 32; negative power supply node 34; output node 36; and ground node 38. Current sources 22 and 24 each represents a signal dependent current from the input stage of a complementary bipolar operational amplifier. Current sources 22 and 24 provide the DC bias and the input signal to the circuit. Resistors 18 and 20 provide additional adjustment to the quiescent current in transistors 14 and 16. Without resistors 18 and 20, the quiescent current in the output can be too large for a given design. Resistors 18 and 20 provide another variable to adjust the quiescent current.

Typically in high-speed op-amps, two paths channel the current generated in the input to the gain node in the circuit where a compensation capacitor 30 is located. FIG. 1 shows top and bottom current sources 22 and 24. These current sources may have different frequency responses. Additionally the path through transistors 12 and 16 to the output node 36 is different to that through transistors 10 and 14. The response through these paths can be adjusted by setting the relative magnitudes of current sources 26 and 28. There is a limit in how much adjustment current sources 26 and 28 can provide since these are used to ensure symmetrical slewrates and short circuit currents. Typically in complementary bipolar circuits, the current in current source 26 is larger than the current in current source 28 because the nominal beta of PNPs is smaller than that of NPNs and the base-collector capacitance of the NPNs is smaller than the PNPs. Both these facts tend to ensure that $I_1$ is greater than $I_2$ in a typical design.

Resistors 18 and 20 interact with capacitor 30 to compensate for variations in phase delay through the two separate paths and can be used to compensate for the differences in the transistor 12 to transistor 16 path to the transistor 10 to transistor 14 path and for the differences between current sources 22 and 24. The combined resistance of resistors 18 and 20 is a constant which is set by emitter areas of transistors 10, 12, 14, and 16, current sources 26 and 28, and the desired quiescent current through transistors 14 and 16. If the paths are the same speed with resistor 18 equal to resistor 20, additional fine adjustments to frequency response can be made by adjusting resistor 18 with respect to resistor 20. Optimization of current sources 26 and 28, and resistors 18 and 20 along with capacitor 30 can lead to a 20–30 percent increase in bandwidth for a given process technology.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A method for adjusting the output response of a complementary bipolar operational amplifier comprising:

providing a first bipolar transistor;

providing a second bipolar transistor coupled to the first bipolar transistor;

providing a first current source coupled to a base of the first bipolar transistor;

providing a second current source coupled to a base of the second bipolar transistor;

providing a third bipolar transistor coupled to the base of the first bipolar transistor;

providing a fourth bipolar transistor coupled to the base of the second bipolar transistor;

providing a first resistor coupled between a base of the third transistor and a common node;

providing a second resistor coupled between a base of the fourth transistor and the common node;

providing a capacitor connected between the common node and a ground node;

providing a first input stage current source coupled to the first resistor;

providing a second input stage current source coupled to the second resistor; and adjusting the first and second current sources and the first and second resistors to optimize the output circuit.

2. The method of claim 1 wherein the first and fourth bipolar transistors are NPN transistors.

3. The method of claim 1 wherein the second and third transistors are PNP transistors.

* * * * *